(12) United States Patent
He et al.

(10) Patent No.: US 10,741,712 B2
(45) Date of Patent: Aug. 11, 2020

(54) PHOTOVOLTAIC MODULE CONTAINING SHINGLED PHOTOVOLTAIC TILES AND FABRICATION PROCESSES THEREOF

(75) Inventors: Gang He, Cupertino, CA (US); Laila S. Mattos, Palo Alto, CA (US); Shawn Scully, San Francisco, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 113 days.

(21) Appl. No.: 13/397,487

(22) Filed: Feb. 15, 2012

(65) Prior Publication Data

US 2013/0206213 A1    Aug. 15, 2013

(51) Int. Cl.
| | |
|---|---|
| *H01L 31/05* | (2014.01) |
| *H01L 31/02* | (2006.01) |
| *H01L 31/048* | (2014.01) |
| *H01L 31/0465* | (2014.01) |
| *H01L 31/042* | (2014.01) |

(52) U.S. Cl.
CPC ...... *H01L 31/0508* (2013.01); *H01L 31/0201* (2013.01); *H01L 31/042* (2013.01); *H01L 31/048* (2013.01); *H01L 31/0465* (2014.12); *H01L 31/0488* (2013.01); *H01L 31/0504* (2013.01); *Y02E 10/50* (2013.01)

(58) Field of Classification Search
CPC ............ H01L 31/0508; H01L 31/0465; H01L 31/0201; H01L 31/042; H01L 31/048; H01L 31/0488; H01L 31/0504
USPC .................................................. 136/242–265
See application file for complete search history.

(56) References Cited

U.S. PATENT DOCUMENTS

| | | | | |
|---|---|---|---|---|
| 5,830,779 | A * | 11/1998 | Bressler et al. | 438/65 |
| 6,469,242 | B1 * | 10/2002 | Kondo | B32B 17/02 |
| | | | | 136/244 |
| 9,412,890 | B1 * | 8/2016 | Meyers | H01L 31/0465 |
| 2003/0026310 | A1 | 2/2003 | Valliath | |

(Continued)

FOREIGN PATENT DOCUMENTS

| | | |
|---|---|---|
| DE | 102010016975 A1 | 1/2011 |
| WO | WO 99/23706 | 5/1999 |
| WO | WO2010133224 A2 | 11/2010 |

OTHER PUBLICATIONS

The International Search Report and the Written Opinion of the International Searching Authority, dated Apr. 15, 2013, for International Application No. PCT/US2013/024411.

(Continued)

*Primary Examiner* — Magali P Slawski
*Assistant Examiner* — Kourtney R S Carlson
(74) *Attorney, Agent, or Firm* — Arent Fox, LLP

(57) ABSTRACT

A photovoltaic module is disclosed. The photovoltaic module comprises an array of shingled tiles disposed between a transparent front substrate and a back substrate, wherein the array of shingled tiles comprises a plurality of photovoltaic tiles in electrically contact with each other and positioned in overlapping rows. Each photovoltaic tile comprises a front metallic contact layer disposed on an epitaxial film stack disposed on a back metallic contact layer disposed on a support carrier layer. The photovoltaic module includes at least one busbar in electrical contact with the array of shingled tiles and disposed between the front and back glass substrates. The photovoltaic module also includes an encapsulation layer between the front and back glass substrates.

24 Claims, 11 Drawing Sheets

(56) References Cited

U.S. PATENT DOCUMENTS

| | | | |
|---|---|---|---|
| 2003/0121228 A1* | 7/2003 | Stoehr et al. .................. | 52/518 |
| 2008/0245405 A1* | 10/2008 | Garvison et al. ............. | 136/251 |
| 2009/0283137 A1 | 11/2009 | Croft et al. | |
| 2010/0078058 A1* | 4/2010 | Nightingale et al. ......... | 136/244 |
| 2010/0139184 A1 | 6/2010 | Williams et al. | |
| 2012/0125391 A1* | 5/2012 | Pinarbasi et al. ............. | 136/244 |
| 2012/0199199 A1* | 8/2012 | Wood et al. .................. | 136/259 |
| 2012/0279548 A1 | 11/2012 | Münch et al. | |
| 2013/0037095 A1* | 2/2013 | Forrest .............. | H01L 31/03046 |
| | | | 136/256 |

OTHER PUBLICATIONS

European Supplementary Search Report for European Application No. EP 13749204 dated Aug. 15, 2015, 6 pages.
Chinese Office Action issued in Chinese Patent Application No. 201380016212.2 dated May 2, 2017.
Chinese Office Action issued in Chinese Patent Application No. 201380016212.2 dated Feb. 2, 2018.
Chinese Notification of Reexamination (with Full English Translation) dated Oct. 25, 2018 issued in Chinese Application No. 201380016212.2.

* cited by examiner

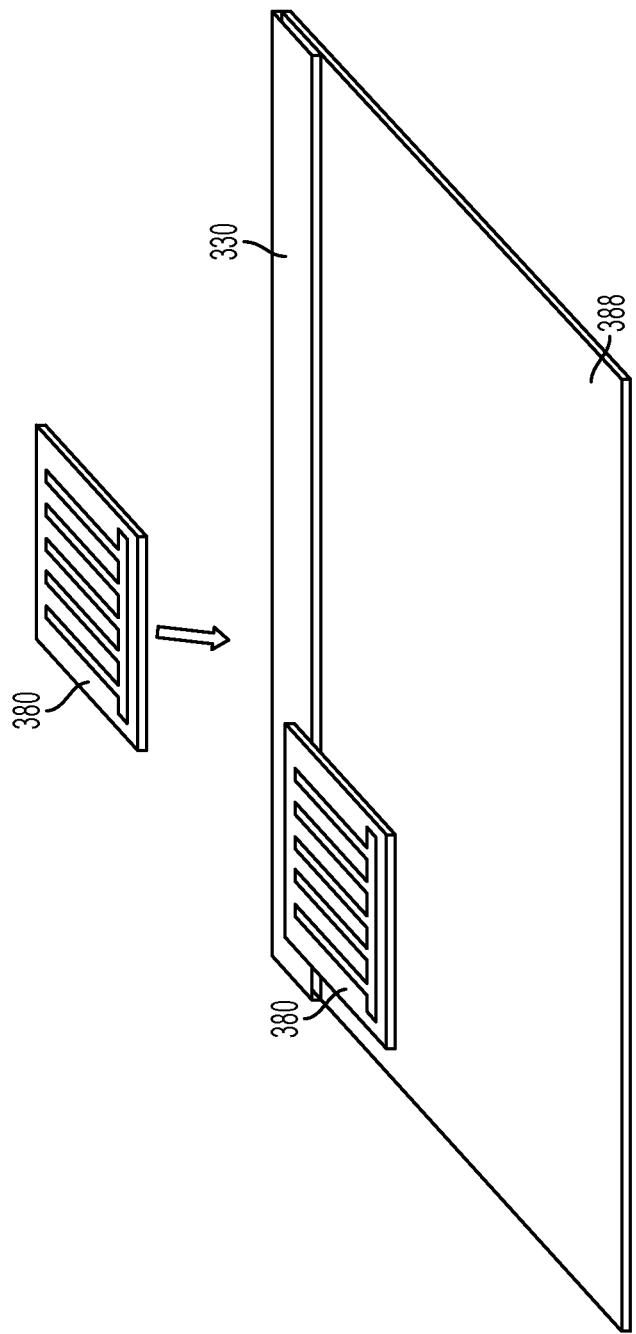

PHOTOVOLTAIC MODULE CONTAINING SHINGLED PHOTOVOLTAIC TILES AND FABRICATION PROCESSES THEREOF

BACKGROUND OF THE INVENTION

Field of the Invention

Embodiments of the invention generally relate to photovoltaic devices and the fabrication thereof, and more particularly to shingled photovoltaic modules and a process form the shingled photovoltaic modules.

Description of the Related Art

There is a need for photovoltaic devices and fabrication processes to form such devices, wherein the photovoltaic devices have maximum cell efficiencies while the fabrication processes minimize manufacturing costs and increase throughput over currently known processes. Accordingly, it is desired to provide such devices. The present invention addresses such a need.

SUMMARY OF THE INVENTION

A photovoltaic module is disclosed. The photovoltaic module comprises an array of shingled tiles disposed between a transparent front substrate and a back substrate, wherein the array of shingled tiles comprises a plurality of photovoltaic tiles in electrically contact with each other and positioned in overlapping rows. Each photovoltaic tile comprises a front metallic contact layer disposed on an epitaxial film stack disposed on a back metallic contact layer disposed on a support carrier layer. The photovoltaic module includes at least one busbar in electrical contact with the array of shingled tiles and disposed between the front and back glass substrates. The photovoltaic module also includes an encapsulation layer between the front and back glass substrates.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1D-1I depict a stepwise schematic of shingled photovoltaic tiles at various fabrication steps according to some embodiments described herein;

DETAILED DESCRIPTION

Embodiments of the invention generally relate to photovoltaic cells, tiles, and modules and the fabrication processes for forming such devices. Each photovoltaic module contains multiple photovoltaic tiles which are positioned in overlapping rows forming an array of shingled tiles. In some embodiments, every other overlapping row of shingled tiles is aligned with each other, while the inbetween overlapping rows are aligned with each other but staggered relative to the adjacent underlying row.

Figure 1A:
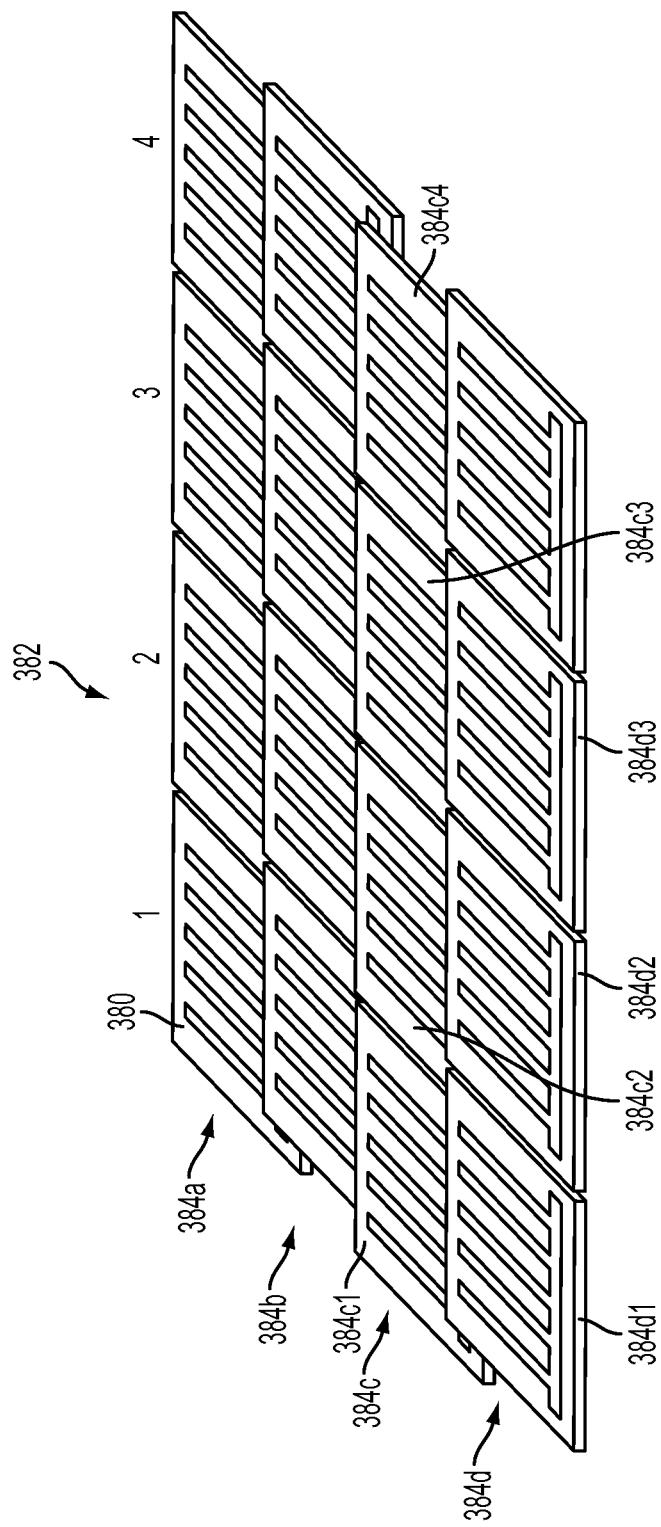
FIGS. 1A-1B depict an array of shingled photovoltaic tiles according to some embodiments described herein.

Shingled tiles structure 382, depicted in FIG. 1A, contain overlapping rows of shingled tiles 380 such that every other overlapping row of shingled tiles is aligned with each other, while the inbetween overlapping rows are aligned with each other but staggered relative to the adjacent underlying row. Shingled tiles structure 382 may be formed by positioning and adhering photovoltaic tiles 380 to each other while forming overlapping rows of photovoltaic tiles 380.

Figure 1B:
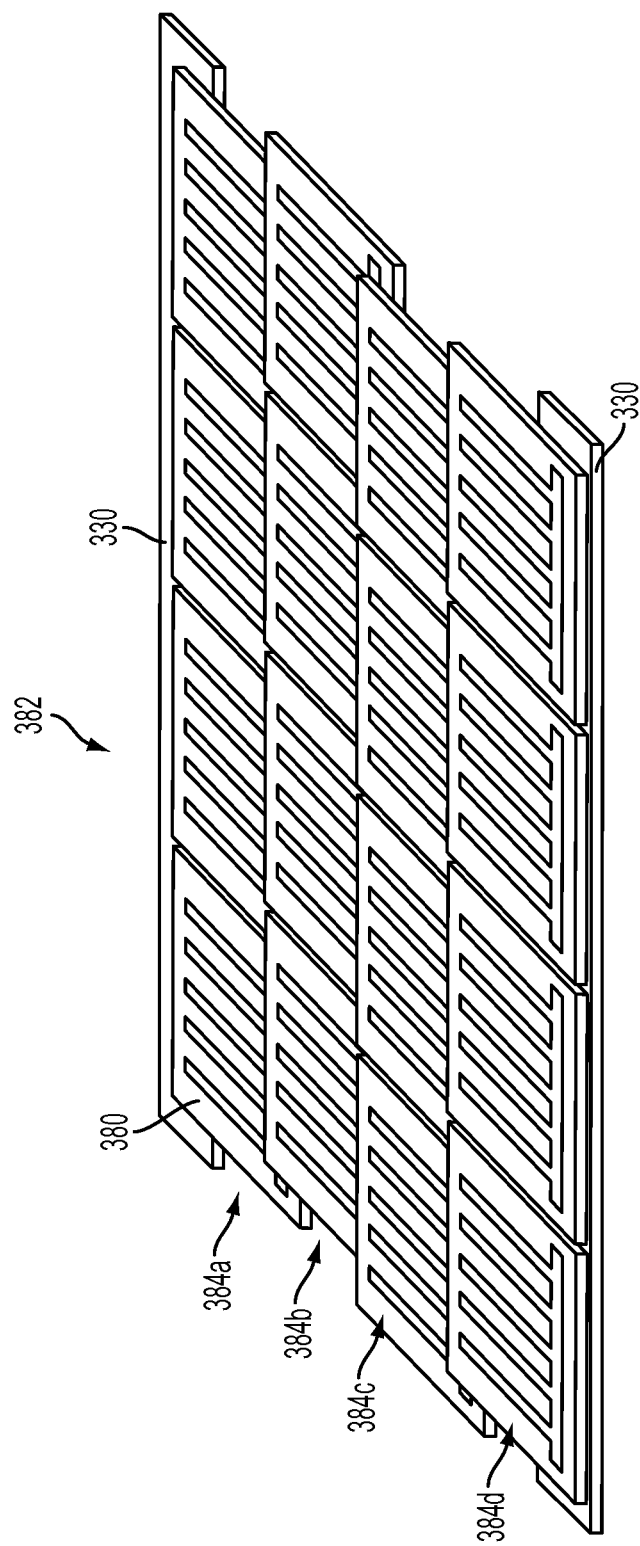
Figure 1C:
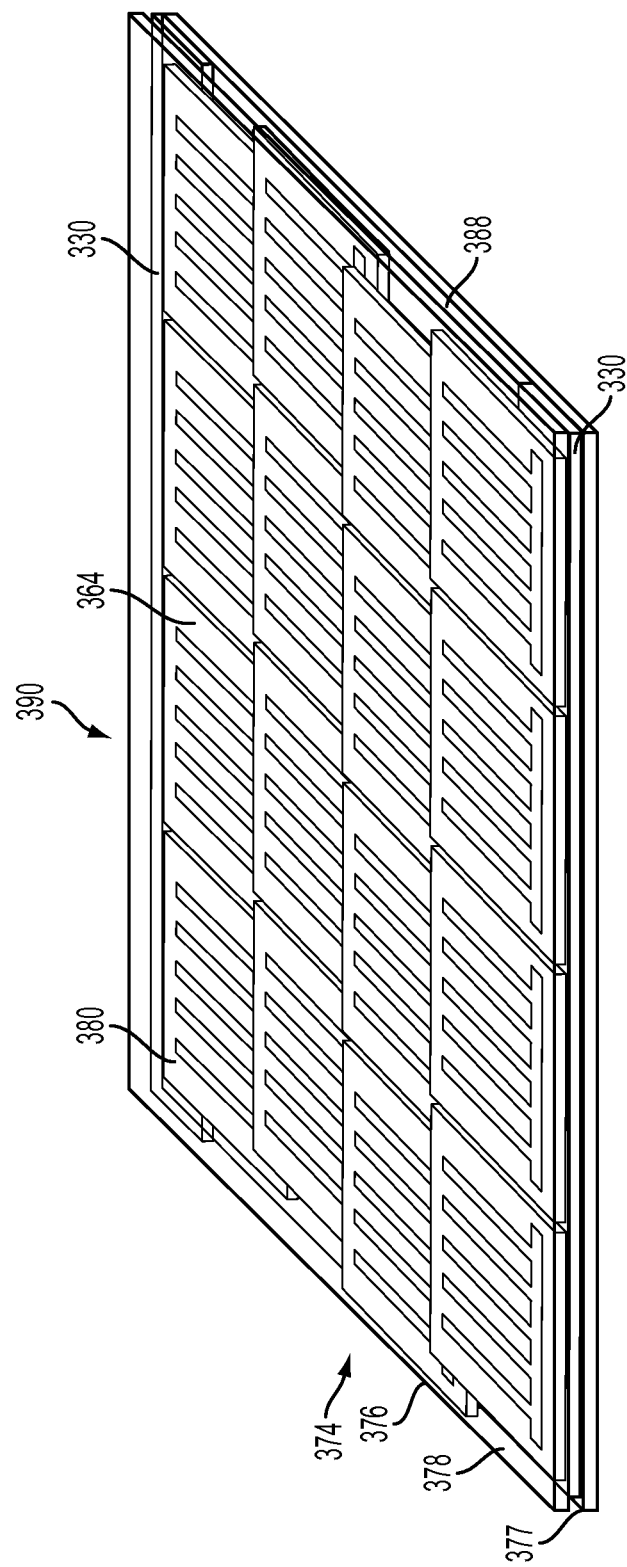
FIG. 1C depicts a photovoltaic module containing shingled photovoltaic tiles according to some embodiments described herein.

In one embodiment, as depicted in FIGS. 1A-1C, individual photovoltaic tiles 380 may be assembled to form an independent sheet or array of shingled tiles 382 (FIG. 1A), which may be further processed by adhering bus bars 330 thereon (FIG. 1B) and subsequently fabricated into photovoltaic module 390 (FIG. 1C). In one example, the independent sheet or array of shingled tiles 382 may be formed by positioning photovoltaic tiles 380, downward facing, into a single row, and subsequently dispensing a conductive adhesive into back contact holes 360. The conductive adhesive is dispensed until back contact holes 360 are overfilled and the conductive adhesive is in physical and electrical contact with back metallic contact layer 308. In an embodiment an insulating adhesive could also be dispensed in combination with conductive adhesive material to make the physical contact mechanically stronger. In so doing, the cost for making the electrical and mechanical connection can be lowered by reducing the amount of conductive material since the insulating material can be significantly less expensive than the conductive material. Thereafter, downward facing photovoltaic tiles 380 are positioned in a second row which overlaps the first row and is slightly staggered to the first row. These steps are repeated by adhering a third row of photovoltaic tiles 380 to the second row of photovoltaic tiles 380—such that the third row is staggered with the second row, but is aligned with the first row of photovoltaic tiles 380.

Each consecutive row after the first row of shingled tiles overlaps with an underlying row of shingled tiles, and every other row of shingled tiles is staggered relative to the rows therebetween. For example, FIG. 1A depicts shingled tile 382 containing rows 384a-384d of photovoltaic tiles 380, as one example of a configuration for the array of shingled tiles 382. Row 384d overlaps row 384c, which overlaps row 384b, which overlaps row 384a. The photovoltaic tiles 380 of row 384a are aligned with the photovoltaic tiles 380 of row 384c. Similarly, the photovoltaic tiles 380 of row 384b are aligned with the photovoltaic tiles 380 of row 384d. However, the photovoltaic tiles 380 of rows 384a and 384c are staggered relative to the photovoltaic tiles 380 of rows 384b and 384d. There can be varying amounts of stagger that will allow different schemes for providing shingled photovoltaic tiles. For example when the stagger is sufficiently small a single type of cell size can be utilized and when the stagger is sufficiently large between photovoltaic tiles smaller tiles can be utilized to fill in the ends of the row.

Furthermore the conductive material can be selectively placed between the shingled tiles to facilitate a particular circuit topology, while insulating adhesive is placed over all overlapping areas to maintain mechanical integrity. For example in one embodiment, referring to the rows 384c and 384d, conductive material may be placed between all cells of the same column where the cell-to-cell overlap is large, and selectively placed between 384c2 and 384d1, 384c4 and 384d3, but not 384c3 and 384d2. In so doing, the interconnect circuit topology of the solar module may be optimized for its performance under environmental factors such as partial shading and damage, as well as cell mismatch.

Figure 3A:
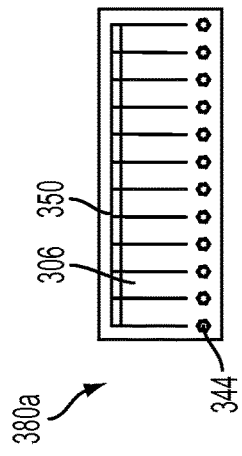
FIGS. 3A-3B depict another photovoltaic tile according to other embodiments described herein.
Figure 3B:
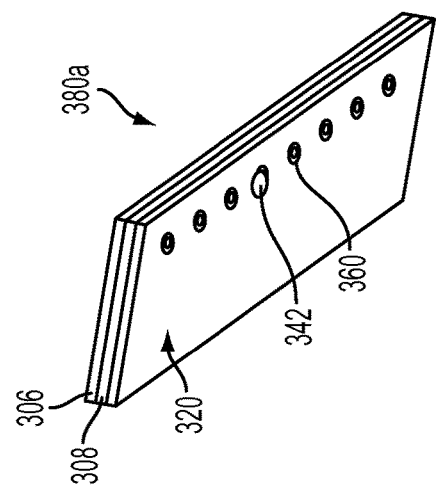
Figure 2A:
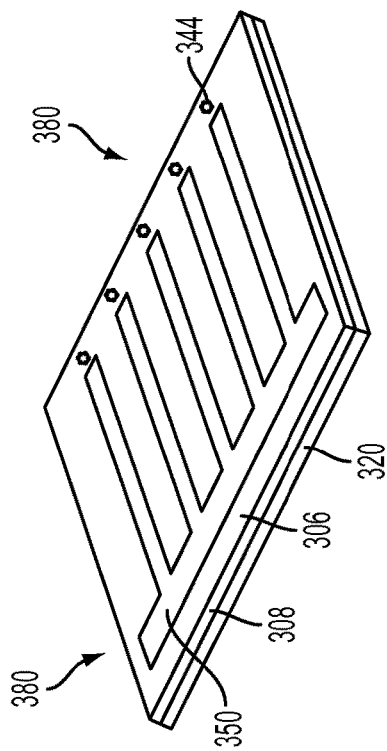
FIGS. 2A-2B depict a photovoltaic tile according to some embodiments described herein.
Figure 2B:
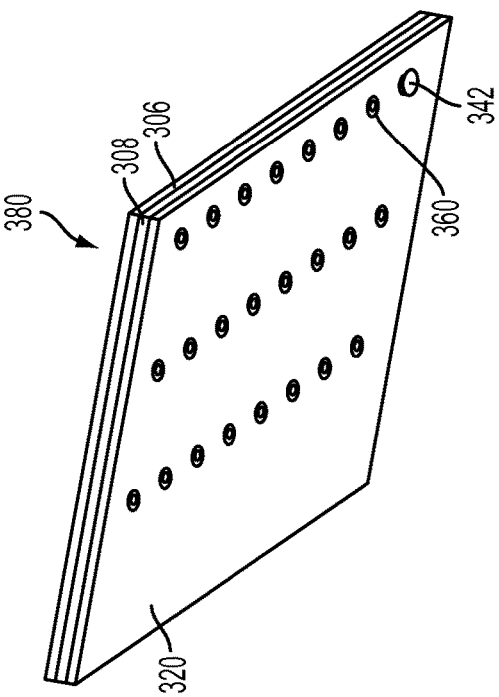

FIGS. 2A-2B depict photovoltaic tile 380 and FIGS. 3A-3B depict another photovoltaic tile 380a, according to embodiments described herein. Photovoltaic tiles 380 and 380a contain P-metal contacts 342 on the bottom surface, such as disposed through and on support carrier tape 320 and N-metal contacts 344 and front metallic contact layer 350 on the front surface, disposed above epitaxial film stack 306. Back contact holes 360 extend through each support carrier tape 320 adhered to the bottom or lower surface of each photovoltaic tile 380 (FIG. 2B) or photovoltaic tile 380a (FIG. 3B). Photovoltaic tiles 380 which are overlapping or underlying each other may be coupled with and in electrical contact to each other by an N-metal contact 344 which is in electrical contact to back metallic contact layer 308 via back contact holes 360 which provide a passageway which may contain the N-metal contact 344 or a portion of the N-metal contact 344. Back contact holes 360 may be formed through support carrier tape 320 prior to adhering the plurality of substrates 300 to the master support carrier tape or back contact holes 360 may be formed through support carrier tape 320 at a different process step.

Figure 4:
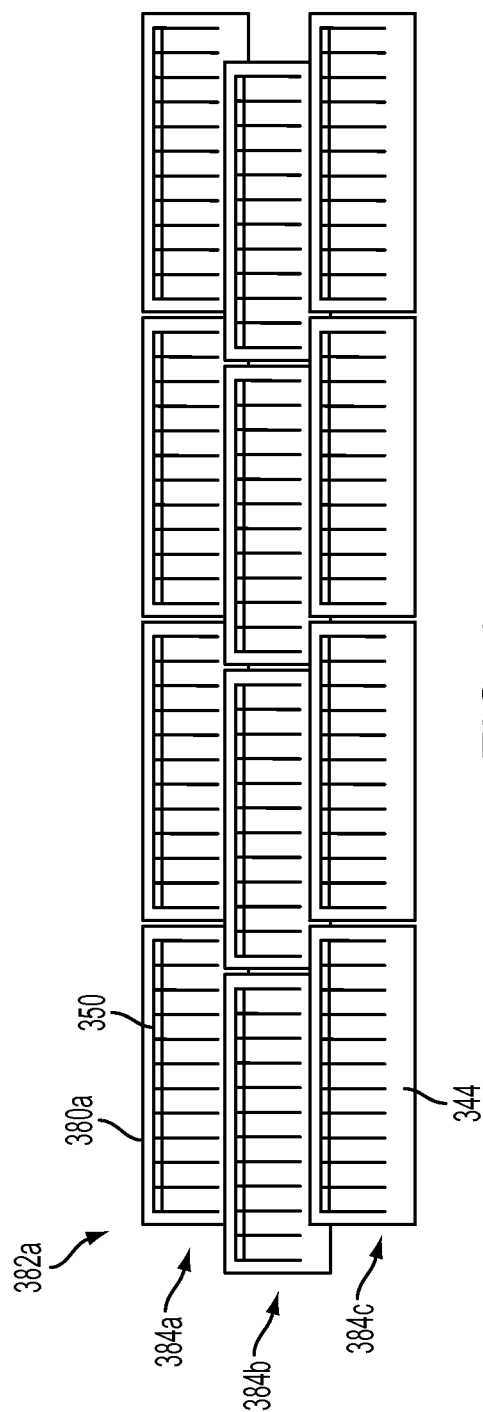
FIG. 4 depicts another array of shingled photovoltaic tiles according to another embodiment described herein.

In another embodiment, FIG. 4 depicts shingled tiles 382a containing a plurality of photovoltaic tiles 380a—which are grouped in three overlapping rows, where row 384c is overlapping row 384b which is overlapping row 384a. Alternatively, the same configuration of rows 384a-384c containing photovoltaic tiles 380a could be described as having row 384a underlying row 384b which is underlying row 384c. Each photovoltaic tile 380a contains P-metal contacts 342 on the bottom surface, such as disposed through and on support carrier tape 320 and contains N-metal contacts 344 and front metallic contacts 350 on the front surface, such as disposed over epitaxial film stack 306. The photovoltaic tiles 380a of row 384c overlaps the photovoltaic tiles 380a of row 384b and the P-metal contacts 342 of the photovoltaic tiles 380a of row 384c are in physical and electrical contact with the N-metal contact 344 of the photovoltaic tiles 380a of row 384b. Similarly, the photovoltaic tiles 380a of row 384b overlaps the photovoltaic tiles 380a of row 384a and the P-metal contacts 342 of the photovoltaic tiles 380a of row 384b are in physical and electrical contact with the N-metal contact 344 of the photovoltaic tiles 380a of row 384a.

In other embodiments, the method for manufacturing photovoltaic module 390s further includes forming multiple back contact holes 360 through support carrier tape 320 prior to adhering the plurality of substrates to support carrier tape 320. Alternatively, back contact holes 360 may be formed through support carrier tape 320 subsequent to adhering the plurality of substrates to support carrier tape 320, for example, after the ELO process. The lower surface of each photovoltaic tile contains a plurality of back contact holes 360 extending through support carrier tape 320 and to the back metallic contact layer.

A conductive material may be placed, inserted, dispensed, injected, formed, deposited, or otherwise positioned into back contact holes 360 to form a contact or interconnect with back metallic contact layer 308. Back contact hole 360 is usually filled, and often over filled, with the conductive material. Upon overfilling, the excess conductive material may be used to adhere a pair of overlapping photovoltaic tiles together—such that the overlapping photovoltaic tiles are physically and electrically in contact with each other. Also, excess conductive material that is overfilled from back contact holes 360 may be used to form a tab contact, a P-metal contact, or other electrically conductive contact may be formed from the conductive material or may be attached to the conductive material. The conductive material may include a conductive adhesive, a conductive epoxy, a cold solder, a solder paste, silver paste, a metal alloy paste, a metallization paste, a conductive paste, a conductive ink, a grid ink, silver ink, or derivative thereof.

Photovoltaic tiles 380 of the underlying row have a tab contact, an N-metal contact, or other electrically conductive contact disposed on an upper surface. Therefore, the P-metal contacts on the lower surfaces of each photovoltaic tile of the overlapping row of shingled tiles are in physical and electrical contact with the N-metal contacts on the upper surface of each photovoltaic tile of the underlapped row of shingled tiles within the array of shingled tiles. Additionally, the busbars (e.g., P/N busbars) may be adhered to the array of shingled tiles by the same conductive material or a different conductive material as used to form physical and/or electrical contacts between the overlapping photovoltaic tiles, for example, a conductive adhesive.

Figure 1E:
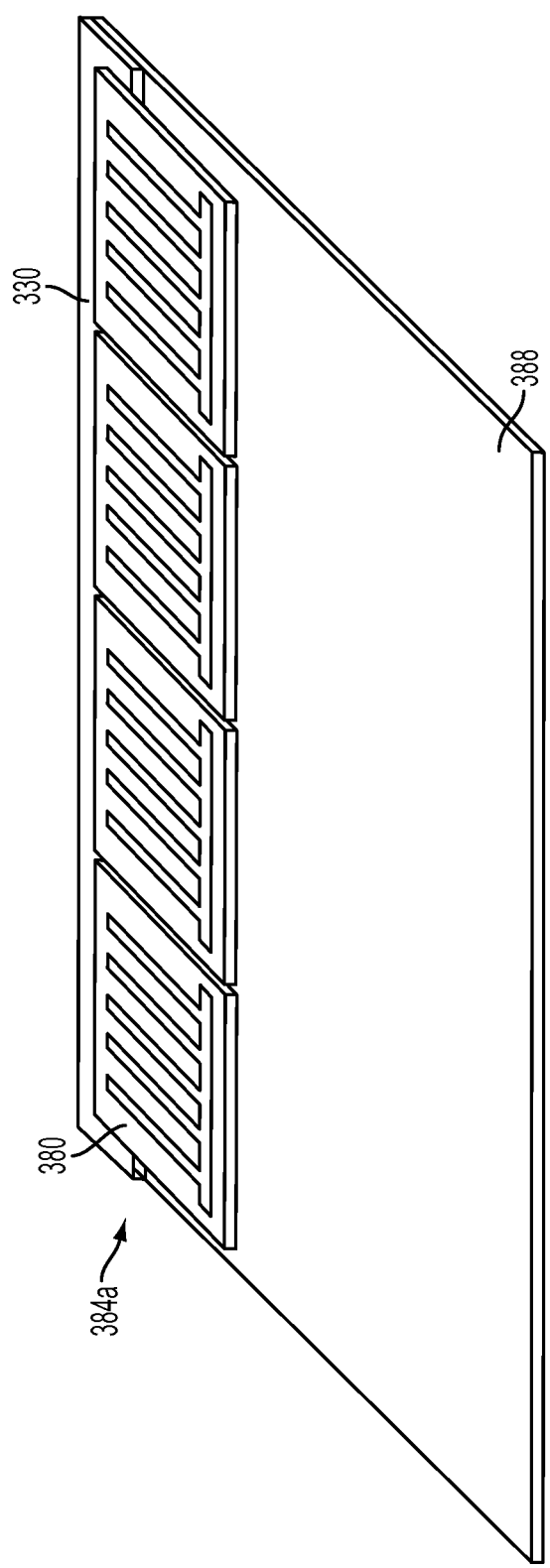
Figure 1F:
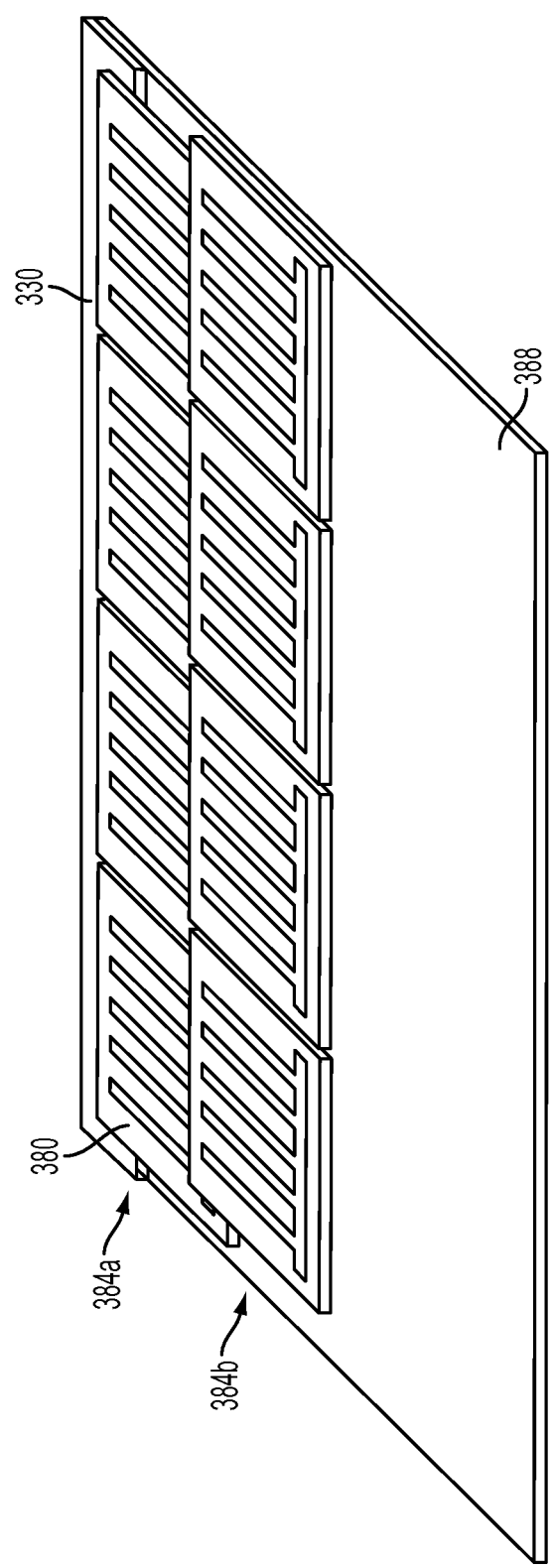
Figure 1G:
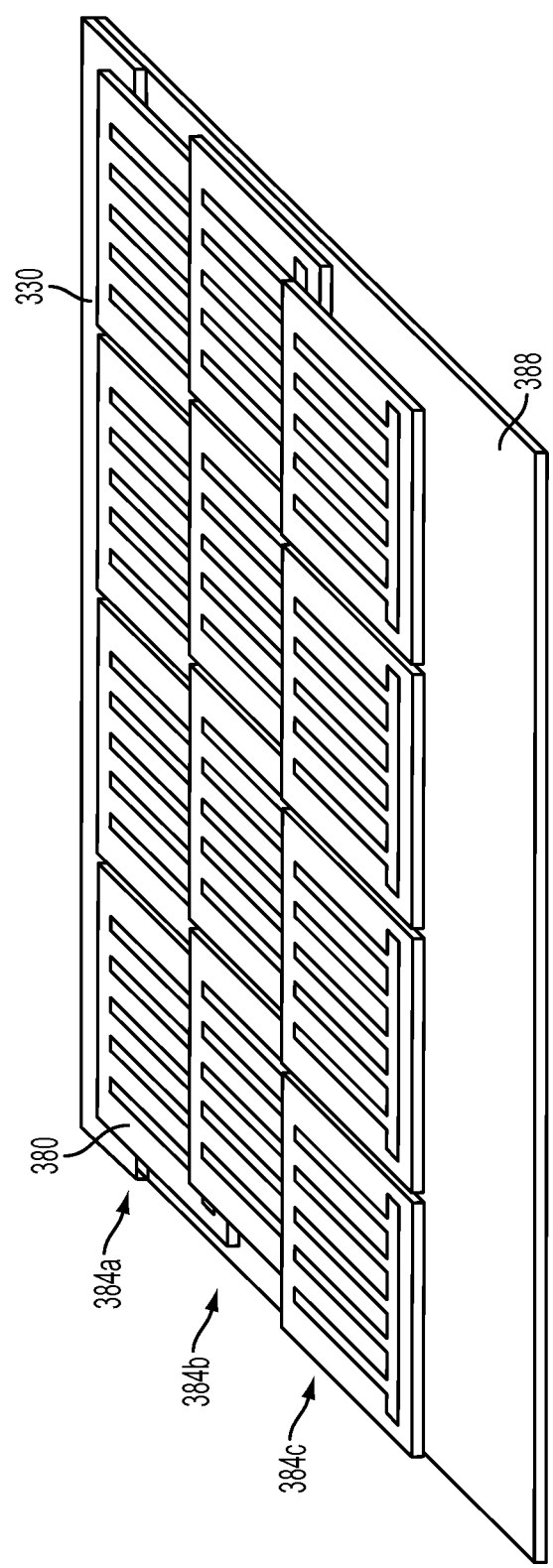
Figure 1H:
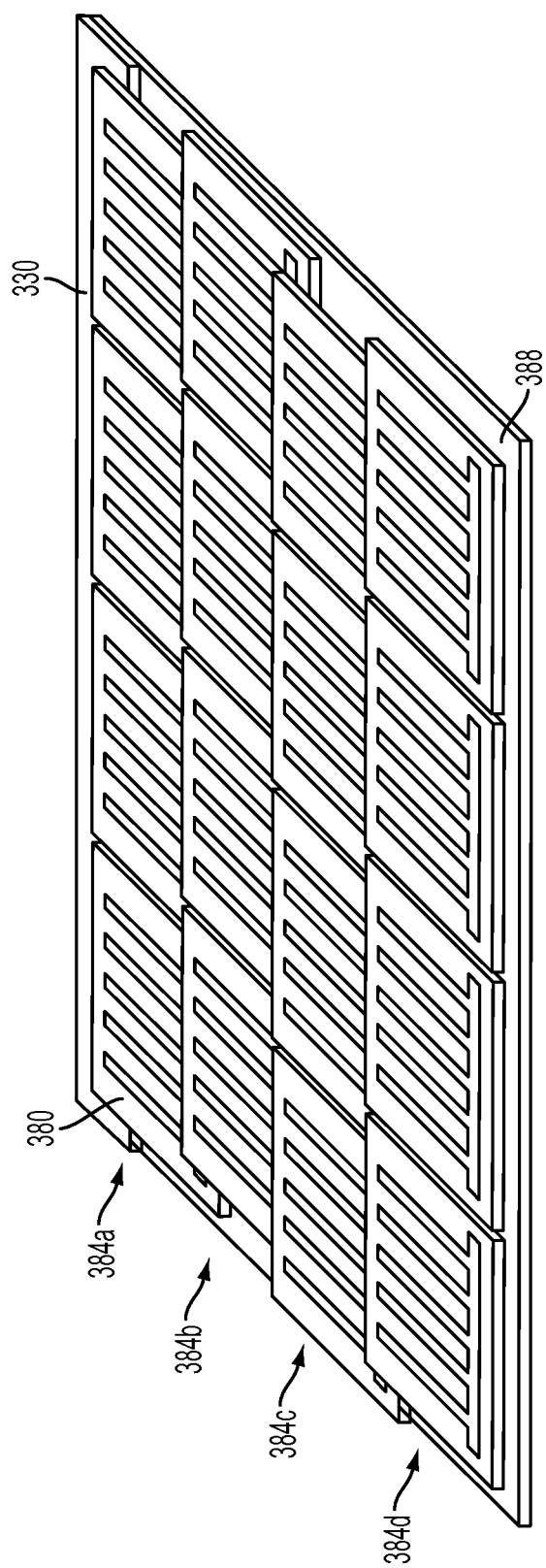
Figure 1I:
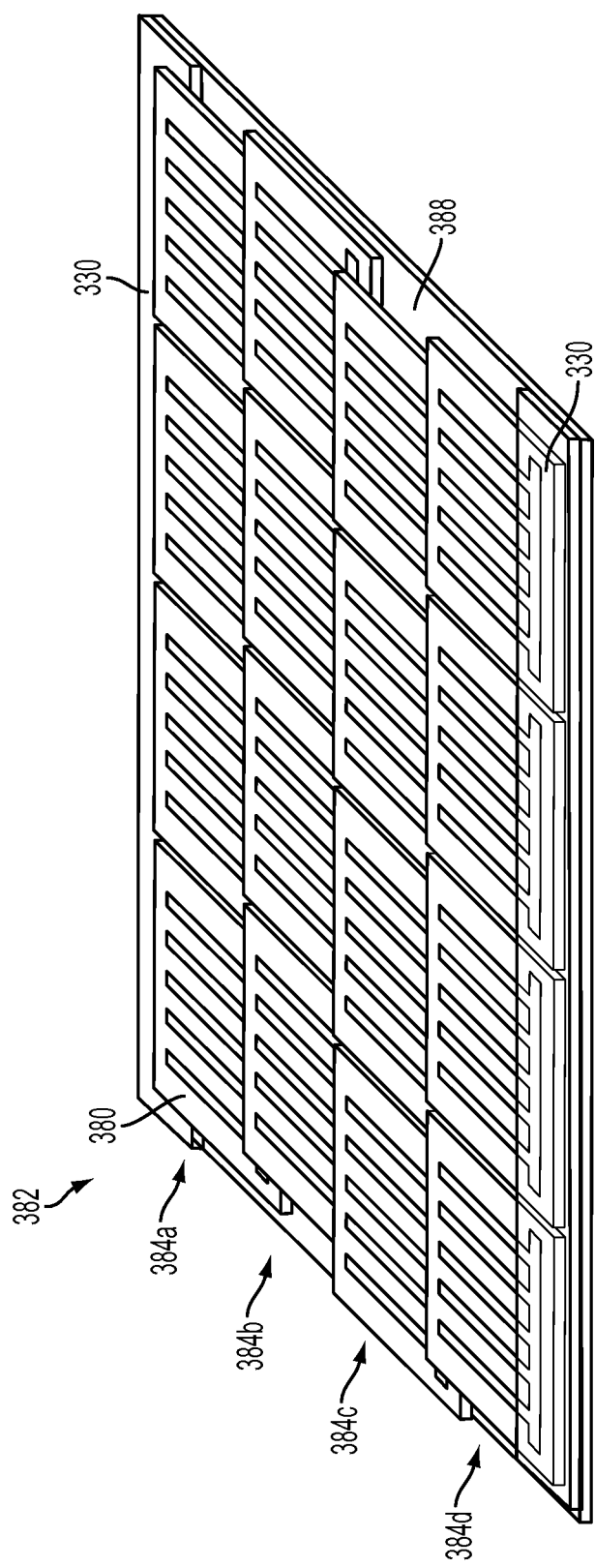

Alternatively, in another embodiment, as depicted in FIGS. 1D-1I, photovoltaic tiles 380 may be individually positioned on and adhered to back glass substrate 388 to form multiple overlapping rows of photovoltaic tiles 380—such as shingled tiles 382—while fabricating photovoltaic module 390. Photovoltaic tiles 380 may be adhered by conductive adhesive, solder, or other conductive materials described herein. Busbar 330 (e.g., P/N busbar) may be positioned and adhered to bottom glass substrate 388, and photovoltaic tiles 380 may be individually positioned overhanging and adhered to busbar 330 to form a first row (row 384a) of photovoltaic tiles 380, as depicted in FIGS. 1D-1E. Thereafter, the photovoltaic tiles 380 of a second row (row 384b) may be individually positioned overhanging and adhered to the photovoltaic tiles 380 of row 384a, as depicted in FIG. 1F. Thereafter, the photovoltaic tiles 380 of a third row (row 384c) may be individually positioned overhanging and adhered to the photovoltaic tiles 380 of row 384b, as depicted in FIG. 1G. Thereafter, the photovoltaic tiles 380 of a fourth row (row 384d) may be individually positioned overhanging and adhered to the photovoltaic tiles 380 of row 384c, as depicted in FIG. 1H. Thereafter, another busbar 330 (e.g., P/N busbar) may be individually positioned and adhered to the photovoltaic tiles 380 of row 384d, as depicted in FIG. 1I.

The photovoltaic tiles disclosed in embodiments herein may have various geometric shapes, which is not limited to polygons. However, many of the photovoltaic tiles used to form shingled tile structure 382 or to fabricate photovoltaic module 390 have a rectangular geometry, such as a rectangle or a square.

An anti-reflective coating (ARC) layer may be deposited on or over the upper surface of the array of shingled tiles 382. The ARC layer may contain one layer or multiple layers of a material having a refractive index within a range from about 1.8 to about 3.7. In one example, two layers of material are deposited on top of each other while forming the ARC layer.

In another embodiment described herein, the combined busbars and the array of shingled tiles 382 are adhered to front glass substrate 378 by a module work-up process. The array of shingled tiles 382 containing busbars 330 may be adhered to front glass substrate 378 such that the upper surface of the array of shingled tiles 382—containing the ARC layer—is facing front glass substrate 378. The busbars usually include positive/negative (PN) busbars and may include a junction box (JB) busbar.

The module work-up process includes dispensing an edge sealant around the outer edges of the inside surface of front glass substrate 378, and then applying an encapsulating adhesive on the inside surface of front glass substrate 378, and positioning the array of shingled tiles 382 containing busbars 330 on the inside surface of front glass substrate 378 and in contact with the encapsulating adhesive. The edge sealant adheres to front glass substrate 378 for subsequent mating with back glass substrate 388.

Subsequently, the module work-up process further includes applying another encapsulating adhesive on the inside surface of back glass substrate 388, flipping over and positioning front glass substrate 378 containing front facing shingled tiles 382 containing busbars 330, then positioning front glass substrate 378 above and mating front glass substrate 378 to back glass substrate 388 to form photovoltaic module 390. Alternatively, back glass substrate 388 may be positioned over busbars 330 and shingled tiles 382 already adhered to front glass substrate 378.

In one embodiment, a photovoltaic module is provided and includes an array of shingled tiles disposed between a front glass substrate and a back glass substrate, such that the array of shingled tiles contains a plurality of photovoltaic tiles in electrically contact with each other and positioned in overlapping rows. Each photovoltaic tile usually contains a front metallic contact layer disposed on or over an epitaxial film stack which is disposed on or over a back metallic contact layer which may be adhered to a portion or segment of a support carrier layer. An ARC layer may be disposed between the array of shingled tiles and the front glass substrate. In one example, the ARC layer may be deposited on the upper or front surface of the array of shingled tiles. The photovoltaic module further contains busbars in electrical contact with the array of shingled tiles and disposed between the front and back glass substrates, as well as a lamination layer covering or coating the front and back glass substrates.

While the foregoing is directed to embodiments of the invention, other and further embodiments of the invention may be devised without departing from the basic scope thereof, and the scope thereof is determined by the claims that follow.

What is claimed is:

1. A photovoltaic module, comprising:
an array of shingled photovoltaic tiles disposed between a transparent front substrate and a back substrate, wherein the array of shingled photovoltaic tiles comprises a plurality of electrically interconnected photovoltaic tiles positioned in overlapping rows including a first photovoltaic tile of a first row overlapped by a second photovoltaic tile of a second row overlapped by a third photovoltaic tile of a third row,
wherein every other overlapping row of shingled tiles is aligned with each other, while the inbetween overlapping rows are aligned with each other but staggered relative to the adjacent underlying row,
wherein each photovoltaic tile comprises a front metallic contact layer having an elongated portion and multiple other portions extending from the elongated portion and which is disposed on an upper surface of an epitaxial film stack which is disposed above a back metallic contact layer which is disposed above a support carrier layer, a surface of the support carrier layer forming a lower surface of the photovoltaic tile,
wherein the second photovoltaic tile contains a plurality of back contact holes extending from its lower surface through its support carrier layer and to its back metallic contact layer such that the plurality of back contact holes of the second photovoltaic tile are positioned directly over and to electrically contact the elongated portion of the front metallic contact layer on the upper surface of the epitaxial film stack of the first photovoltaic tile,
wherein the third photovoltaic tile contains a plurality of back contact holes extending from its lower surface through its support carrier layer and to its back metallic contact layer such that the plurality of back contact holes of the third photovoltaic tile are positioned directly over and to electrically contact the elongated portion of the front metallic contact layer on the upper surface of the epitaxial film stack of the second photovoltaic tile,
wherein the back contacts holes of the second photovoltaic tile in electrical contact with the elongated portion of the front metallic layer of the first photovoltaic layer and the back contacts holes of the third photovoltaic tile in electrical contact with the elongated portion of the front metallic layer of the second photovoltaic layer form electrical passageways to electrically interconnect the first photovoltaic tile and the third photovoltaic tile through the second photovoltaic tile,
wherein an electrically conductive adhesive is disposed within the plurality of back contact holes to provide direct physical contact and direct electrical contact between the back metallic contact layer of the second photovoltaic tile and the elongated portion of the front metallic layer of the first photovoltaic tile through the support carrier layer of the second photovoltaic tile, and between the back metallic contact layer of the third photovoltaic tile and the elongated portion of the front metallic layer of the second photovoltaic tile through the support carrier layer of the third photovoltaic tile;
at least one busbar in electrical contact with the array of shingled tiles and disposed between the transparent front substrate and the back substrate; and
encapsulation layers disposed between the transparent front substrate and the back substrate, wherein the encapsulation layers include an encapsulating adhesive between the transparent front substrate and the back substrate.

2. The photovoltaic module of claim 1, wherein the at least one busbar includes a positive/negative (PN) busbar and a junction box (JB) busbar which may be connected to a positive, a negative or a middle side of the shingled tile array.

3. The photovoltaic module of claim 2, wherein the array of shingled tiles are coupled to each other by an electrically conductive material, and the at least one busbar is coupled to the array of shingled tiles by the electrically conductive material.

4. The photovoltaic module of claim 3, wherein the electrically conductive material comprises a solder.

5. The photovoltaic module of claim 3, wherein the electrically conductive material is an electrically conductive adhesive.

6. The photovoltaic module of claim 1, wherein an insulating material is dispensed in combination with the electrically conductive material in the back contact holes of the second and third photovoltaic tiles to increase the mechanical strength of the physical contact between the back metallic contact layer and the elongated portion of the front metallic layer of respective overlapping tiles.

7. The photovoltaic module of claim 1, wherein the array of shingled tiles are staggered such that a single type of shingled tiles is utilized when the staggering is sufficiently small.

8. The photovoltaic module of claim 1, wherein the array of shingled tiles are staggered such that different types of shingled tiles are utilized, wherein when the staggering is sufficiently large using one type of shingled tile, a shingled tile of another type is utilized to fill in an end of a row.

9. The photovoltaic module of claim 1, wherein a conductive material is selectively dispensed between the shingled tiles in accordance with a particular electrical topology.

10. The photovoltaic module of claim 1, wherein the transparent front substrate comprises glass or flexible polymers, and the back substrate comprises any of glass, polymer, metal, or a composite of these materials.

11. The photovoltaic module of claim 1, wherein the encapsulation layers include an edge sealant around the outer edges of an inside surface of the transparent front substrate.

12. The photovoltaic module of claim 1, wherein the electrically conductive adhesive is dispensed within the back contact holes of the second and third photovoltaic tiles until overfilled to provide physical contact and electrical contact between the back metallic contact layer and the elongated portion of the front metallic layer of respective overlapping tiles through the support carrier layer.

13. The photovoltaic module of claim 1, wherein the elongated portion of the front metallic layer of the first photovoltaic tile is positioned on one side along a length of the first photovoltaic tile, and the plurality of back contact holes of the second photovoltaic tile are positioned on an opposite side along a length of the second photovoltaic tile such that the overlapping portion between the first photovoltaic tile and the second photovoltaic tile includes the one side along the length of the first photovoltaic tile and the opposite side along the length of the second photovoltaic tile.

14. A method for providing a photovoltaic module, comprising:
providing an array of shingled photovoltaic tiles disposed between a transparent front substrate and a back substrate, wherein the array of shingled photovoltaic tiles comprises a plurality of photovoltaic tiles positioned in overlapping rows including a first photovoltaic tile of a first row overlapped by a second photovoltaic tile of a second row overlapped by a third photovoltaic tile of a third row,
wherein every other overlapping row of shingled tiles is aligned with each other, while the inbetween overlapping rows are aligned with each other but staggered relative to the adjacent underlying row,
wherein each photovoltaic tile comprises a front metallic contact layer having an elongated portion and multiple other portions extending from the elongated portion and which is disposed on an upper surface of an epitaxial film stack which is disposed above a back metallic contact layer which is disposed above a support carrier layer, a surface of the support carrier layer forming a lower surface of the photovoltaic tile, and
wherein the second photovoltaic tile contains a plurality of back contact holes extending from its lower surface through its support carrier layer and to its back metallic contact layer such that the plurality of back contact holes of the second photovoltaic tile are positioned directly over and to electrically contact the elongated portion of the front metallic contact layer on the upper surface of the epitaxial film stack of the first photovoltaic tile,
wherein the third photovoltaic tile contains a plurality of back contact holes extending from its lower surface through its support carrier layer and to its back metallic contact layer such that the plurality of back contact holes of the third photovoltaic tile are positioned directly over and to electrically contact the elongated portion of the front metallic contact layer on the upper surface of the epitaxial film stack of the second photovoltaic tile,
wherein the back contacts holes of the second photovoltaic tile in electrical contact with the elongated portion of the front metallic layer of the first photovoltaic layer and the back contacts holes of the third photovoltaic tile in electrical contact with the elongated portion of the front metallic layer of the second photovoltaic layer form electrical passageways to electrically interconnect the first photovoltaic tile and the third photovoltaic tile through the second photovoltaic tile,
wherein an electrically conductive adhesive is dispensed within the plurality of back contact holes to provide direct physical contact and direct electrical contact between the back metallic contact layer of the second photovoltaic tile and the elongated portion of the front metallic layer of the first photovoltaic tile through the support carrier layer of the second photovoltaic tile, and between the back metallic contact layer of the third photovoltaic tile and the elongated portion of the front metallic layer of the second photovoltaic tile through the support carrier layer of the third photovoltaic tile,
wherein the upper surface of the epitaxial film stack of the first photovoltaic layer contacts the lower surface of the second photovoltaic layer and the upper surface of the epitaxial film stack of the second photovoltaic layer contacts the lower surface of the of the third photovoltaic layer directly or via the electrically conductive adhesive;
providing at least one busbar in electrical contact with the array of shingled tiles and disposed between the transparent front substrate and the back substrate, wherein a first busbar of the at least one busbar is disposed in contact with the back substrate and the first photovoltaic tile; and
providing encapsulation layers between the transparent front substrate and the back substrate, wherein the encapsulation layers include an encapsulating adhesive between the transparent front substrate and the back substrate.

15. The method of claim 14, wherein the array of shingled tiles are coupled to each other by an electrically conductive material, and the at least one busbar is coupled to the array of shingled tiles by the electrically conductive material.

16. The method of claim 15, wherein the electrically conductive material comprises a solder.

17. The method of claim 15, wherein the electrically conductive material is an electrically conductive adhesive.

18. The method of claim 14 wherein an insulating material is dispensed in combination with the electrically conductive material in the back contact holes of the second and third photovoltaic tiles to increase the mechanical strength of the physical contact between the back metallic contact layer and the elongated portion of the front metallic layer of respective overlapping tiles.

19. The method of claim 14, wherein the array of shingled tiles are staggered such that a single type of shingled tiles is utilized when the staggering is sufficiently small.

20. The method of claim 14, wherein the array of shingled tiles are staggered such that different types of shingled tiles can be utilized, wherein when a staggering is sufficiently large using one type of shingled tile, a shingled tile of another type is utilized to fill in an end of a row.

21. The method of claim 15, wherein a conductive material is selectively dispensed between the shingled tiles in accordance with a particular electrical topology.

22. The method of claim 14, further comprising forming the plurality of contact holes of the second and third photovoltaic tiles through the respective support carrier layers prior to adhering the at least one of the photovoltaic tiles to the support carrier layer.

23. The method of claim 14, further comprising forming the plurality of contact holes of the second and third photovoltaic tiles through the respective support carrier layers after adhering the at least one of the photovoltaic tiles to the support carrier layer.

24. The method of claim 14, wherein the elongated portion of the front metallic layer of the first photovoltaic tile is positioned on one side along a length of the first photovoltaic tile, and the plurality of back contact holes of the second photovoltaic tile are positioned on an opposite side along a length of the second photovoltaic tile such that the overlapping portion between the first photovoltaic tile and the second photovoltaic tile includes the one side along the length of the first photovoltaic tile and the opposite side along the length of the second photovoltaic tile.

* * * * *